(12) United States Patent
Lee

(10) Patent No.: US 6,642,095 B2
(45) Date of Patent: Nov. 4, 2003

(54) METHODS OF FABRICATING SEMICONDUCTOR DEVICES WITH BARRIER LAYERS

(75) Inventor: Seok-Woo Lee, Chungcheongbuk-do (KR)

(73) Assignee: Hyundai Electronics Industries Co., Ltd., Ichon-Shi (KR)

( * ) Notice: Subject to any disclaimer, the term of this patent is extended or adjusted under 35 U.S.C. 154(b) by 0 days.

(21) Appl. No.: 09/845,183

(22) Filed: May 1, 2001

(65) Prior Publication Data

US 2002/0039844 A1 Apr. 4, 2002

(30) Foreign Application Priority Data

Sep. 29, 2000 (KR) .......................................... 2000-57282

(51) Int. Cl.[7] ...................... H01L 21/8238; H01L 21/31
(52) U.S. Cl. ........................ 438/216; 438/769; 438/778
(58) Field of Search ................................ 438/778, 257, 438/199, 216, 769

(56) References Cited

U.S. PATENT DOCUMENTS

| | | | | |
|---|---|---|---|---|
| 5,134,085 A | * | 7/1992 | Gilgen et al. | 257/298 |
| 5,407,870 A | * | 4/1995 | Okada et al. | 257/411 |
| 6,133,605 A | * | 10/2000 | Kishi | 257/324 |
| 6,177,311 B1 | * | 1/2001 | Kauffman et al. | 438/257 |
| 6,251,761 B1 | * | 6/2001 | Rodder et al. | 438/199 |
| 6,365,467 B1 | * | 4/2002 | Joo | 438/216 |

* cited by examiner

Primary Examiner—W. David Coleman
(74) Attorney, Agent, or Firm—Fleshner & Kim, LLP

(57) ABSTRACT

The present invention relates to semiconductor device and a fabricating methods thereof which enable to improve device characteristics such as threshold voltage and the like by preventing p type impurities doping a gate from penetrating into a channel region of a substrate through a $SiO_2$ layer. The present invention also relates to preventing transconductance due to reciprocal reaction of traps from decreasing by re-oxidation, wherein a first and a second oxynitride layer are formed at a first interface between a $SiO_2$ layer and a gate of p-doped polysilicon and a second interface between the $SiO_2$ layer and a silicon substrate, respectively.

24 Claims, 4 Drawing Sheets

METHODS OF FABRICATING SEMICONDUCTOR DEVICES WITH BARRIER LAYERS

BACKGROUND OF THE INVENTION

1. Field of the Invention

The present invention relates to a semiconductor device and fabricating methods thereof.

2. Background of the Related Art

In semiconductor devices, as CMOS transistors get more highly-integrated, the sizes of NMOS and PMOS transistors become smaller. Thus, device characteristics are deteriorated due to short channels, hot carriers and the like. Therefore, an LDD (lightly doped drain) structure has been utilized for the fabrication of the NMOS/PMOS transistors to improve device characteristics.

When gates of the NMOS and PMOS transistors of CMOS are doped with the same n type impurities, a channel region of the PMOS is not formed at the surface of the substrate but rather, is formed in the bulk, thereby reducing breakdown voltage due to punch-through.

Therefore, dual-gated CMOS transistors consisting of PMOS and NMOS transistors which are heavily doped with p and n type impurities respectively have been developed. The PMOS transistor of the dual-gated CMOS transistor has a channel region at the surface of the substrate, thereby preventing breakdown voltage from being reduced due to punch-through.

When an $SiO_2$ gate oxide layer is introduced to a PMOS transistor which has a gate electrode made of boron-doped polysilicon, boron ions diffuse into the channel region of a silicon substrate through the gate oxide layer causing the threshold voltage of a completed PMOS transistor to vary.

Accordingly, in the related art, an oxynitride layer consisting of nitrogen piled up at an interface between the gate oxide layer and the silicon substrate formed by annealing in NO (nitric oxide) is used to prevent variations of the threshold voltage in a PMOS transistor due to boron penetration.

FIG. 1A to FIG. 1C show cross-sectional views of forming a gate insulating layer consisting of oxynitride and silicon oxide in a semiconductor device in the related art.

Referring to FIG. 1A, a silicon oxide layer 11 for forming a gate insulating layer is formed on a silicon substrate 10 of a semiconductor substrate where a device isolating area and a device active region are defined by a device isolation layer such as a field oxide layer formed by LOCOS (local oxidation of silicon) or STI (shallow trench isolation). In this case, the area shown in FIG. 1A represents the device active area which may be referred to as a silicon substrate doped with n type impurities or as an n type well.

If the device isolation layer is formed after the formation of the well, a field oxide layer may be formed by LOCOS or STI at the junction between n and p type wells for electrical device isolation. Additionally, ion implantation is carried out for adjusting threshold voltage of a PMOS device in the exposed silicon substrate 10 before the formation of a silicon oxide layer.

Referring to FIG. 1B, nitric oxide (hereinafter abbreviated NO) annealing is carried out on the exposed silicon oxide layer 11. As a result of the NO annealing, an oxynitride layer 12 is formed consisting of nitrogen piled up at an interface between the silicon substrate 10 and the silicon oxide layer 11. The oxynitride layer 12, as well as, the silicon oxide layer 11 in part become a gate insulating layer for a MOS transistor. Thus, the oxynitride layer 12 provides traps at the interface, and the traps in turn reduce transconductance of the gate insulating layer.

Referring to FIG. 1C, a polysilicon layer 13 doped with p type impurities such as boron and the like is formed on the exposed silicon oxide layer 11 by chemical vapor deposition (hereinafter abbreviated CVD). After, a gate electrode is formed by patterning the doped polysilicon layer 13, the silicon oxide layer 11, and the oxynitride layer 12 by photolithography. A PMOS transistor is completed by forming p type impurity diffusion regions doped with B, $BF_2$ or the like in the substrate centering around the gate electrode.

Unfortunately, in the related art, oxynitride is formed only at an interface between the silicon oxide layer and the silicon substrate, thereby only somewhat reducing transconductance of the gate insulating layer due to reciprocal interaction among traps generated from oxynitride. Moreover, the related art reduces device reliability due to a threshold voltage shift caused by failing to prevent boron penetration into the channel region because boron ions still diffuse into the gate oxide layer despite the formation of the oxynitride layer between the silicon oxide layer and the silicon substrate.

The above references are incorporated by reference herein where appropriate for appropriate teachings of additional or alternative details, features and/or technical background.

SUMMARY OF THE INVENTION

An object of the invention is to solve at least the above problems and/or disadvantages and to provide at least the advantages described hereinafter.

An object of the invention is to improve device characteristics such as a threshold voltage and the like.

Another object of the present invention is to prevent impurities from penetrating into a channel region.

A further object of the present invention is to prevent transconductance.

A further object of the present invention is to prevent problems caused by reciprocal reaction of traps from decreasing by re-oxidation.

The object of the present invention is to provide a gate insulating layer of a PMOS device which improves device characteristics such as threshold voltage and the like by preventing p type impurities from penetrating into a channel region of a substrate through an $SiO_2$ layer as well as preventing transconductance due to reciprocal interaction of traps, wherein a first and a second oxynitride layer are formed at a first interface between a $SiO_2$ layer and a gate of p-doped polysilicon and a second interface between the $SiO_2$ layer and a silicon substrate, respectively.

Another object of the present invention is to provide a method of forming a gate insulating layer of a PMOS device which improves device characteristics such as threshold voltage and the like by preventing p type impurities from penetrating into a channel region of a substrate through a $SiO_2$ layer as well as preventing transconductance due to reciprocal interaction of traps, wherein a silicon nitride layer is formed on a undoped polysilicon layer and wherein a first and a second oxynitride layer are formed at a first interface between a $SiO_2$ layer and a gate of p-doped polysilicon and a second interface between the $SiO_2$ layer and a silicon substrate, respectively.

Another object of the present invention is to provide a PMOS transistor including a gate electrode and impurity diffusion region which improves device characteristics such as threshold voltage and the like by providing a gate insulating layer consisting of oxynitride/silicon oxide/ oxynitride to prevent boron penetration into a substrate and by removing traps existing in oxynitride by re-oxidation to improve transconductance of the gate insulating layer.

A further object of the present invention is to provide a method of fabricating a PMOS transistor which improves device characteristics such as threshold voltage and the like by preventing p type impurities from penetrating into a channel region of a substrate through an $SiO_2$ layer as well as preventing transconductance due to reciprocal interaction of traps from decreasing by re-oxidation, wherein the PMOS transistor is fabricated by forming a first oxynitride layer, an $SiO_2$ layer, a second oxynitride layer, a polysilicon layer and a nitride layer, by patterning the above layers to form a gate electrode and a gate insulating layer and by forming source and drain regions.

As a device becomes more highly integrated, the size of the device is reduced, thus leading to the gate insulating layer of the device becoming thinner. In a PMOS transistor having such a thin gate insulating layer, boron as a dopant for a gate electrode can then penetrate into the gate insulating layer and further into a channel region of a substrate to change the threshold voltage of a transistor.

However, lots of traps exist in oxynitride formed by annealing of NO, thereby reducing transconductance of the gate insulating layer.

A further object of the present invention is to improve characteristics by removing the traps for reducing transconductance thereof by re-oxidation.

Namely, the present invention prevents boron penetration by fabricating a semiconductor using the following steps.

First, an undoped polysilicon layer for forming a gate is formed on a silicon oxide layer beneath which a first oxynitride layer lies. And, a silicon nitride layer is formed on the undoped polysilicon layer.

After boron ion implantation has been carried out on the polysilicon for electric conduction, a second oxynitride layer is formed at an interface between the polysilicon and silicon oxide layers by annealing. In this case, the second oxynitride layer is formed in a manner that accelerated boron ions inject nitrogen of the silicon nitride layer into the interface between the silicon oxide and polysilicon layers through the polysilicon layer.

Moreover, after a first oxynitride layer has been formed by carrying out NO annealing on a silicon oxide layer, the present invention carries out re-oxidation on the silicon oxide and oxynitride layers to remove traps capturing electrons. Thus, transconductance of the gate insulating layer is improved by the present invention.

To achieve these and other advantages and in accordance with the purpose of the present invention, as embodied and broadly described, a preferred embodiment of the present invention includes forming an insulating layer on a semiconductor substrate, forming a first barrier layer at an interface between the semiconductor substrate and the insulating layer, forming a semiconductor layer on the insulating layer, and forming a second barrier layer at an interface between the semiconductor layer and the insulating layer.

In another aspect, a preferred embodiment of a method of the present invention includes forming an insulating layer on a semiconductor substrate, forming a first barrier layer at an interface between the semiconductor substrate and the insulating layer, forming a semiconductor layer on the insulating layer, forming a second barrier layer at an interface between the semiconductor layer and the insulating layer, forming a gate electrode by patterning the semiconductor layer, and forming impurity regions around the gate electrode in the substrate.

In a further aspect, the present invention includes an insulating layer on a semiconductor substrate, a first barrier layer at an interface between the semiconductor substrate and the insulating layer, a gate electrode over the insulating layer, and a second barrier layer at an interface between the gate electrode and the insulating layer.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

The present invention improves transconductance of a gate insulating layer and prevents boron ions from penetrating into a substrate by constituting the gate insulating layer of oxynitride/silicon oxide/oxynitride for a PMOS transistor and by removing traps existing in an oxynitride layer by re-oxidation.

FIG. 2A to FIG. 2F show cross-sectional views of forming a gate insulating layer in a semiconductor device according to a preferred embodiment of the present invention.

Figure 1A:
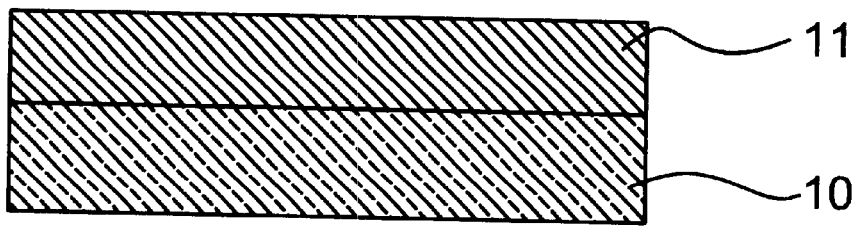
FIG. 1A to FIG. 1C illustrate a diagram of cross-sectional views of forming a gate insulating layer in a semiconductor device according to a related art.
Figure 1B:
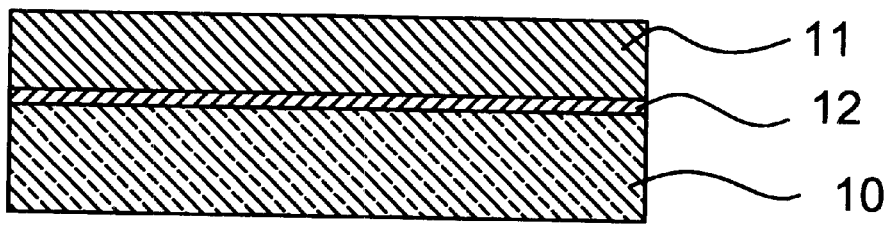
Figure 1C:
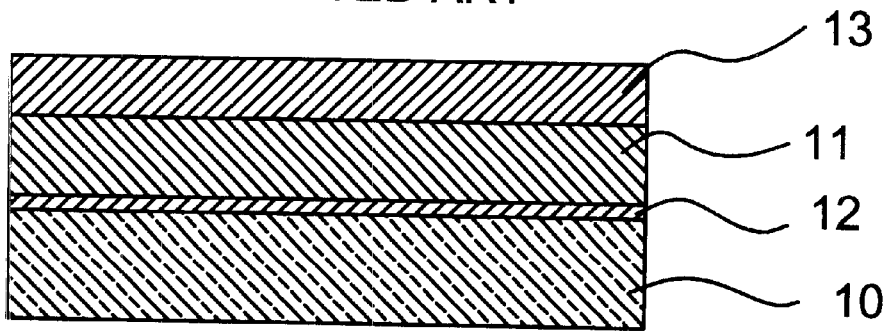
Figure 2A:
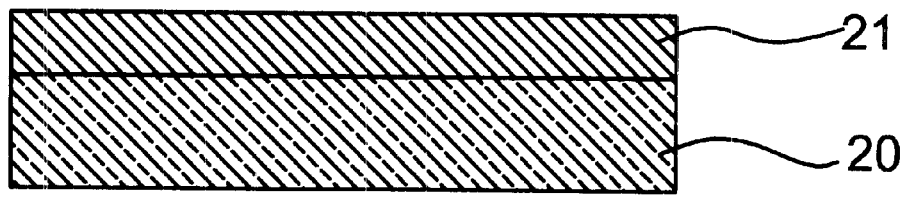
FIG. 2A to FIG. 2F illustrate a diagram of cross-sectional views of forming a gate insulating layer in a semiconductor device according to the present invention.

Referring to FIG. 2A, a silicon oxide layer 21 for forming a gate insulating layer is formed on a silicon substrate 20 of a semiconductor substrate where a device isolating area and a device active region are defined by a device isolation layer such as a field oxide layer formed by LOCOS (local oxidation of silicon) or STI (shallow trench isolation). In this case, the area shown in FIG. 2A represents the device active area which may be referred to as a silicon substrate doped with n type impurities or an n type well.

If the device isolation layer is formed after the formation of the well, a field oxide layer may be formed by LOCOS or STI at the junction between n and p type wells for electrical device isolation. Also, before the formation of a silicon oxide layer, ion implantation for adjusting threshold voltage of a PMOS device is carried out in the exposed silicon substrate 20.

Figure 2B:
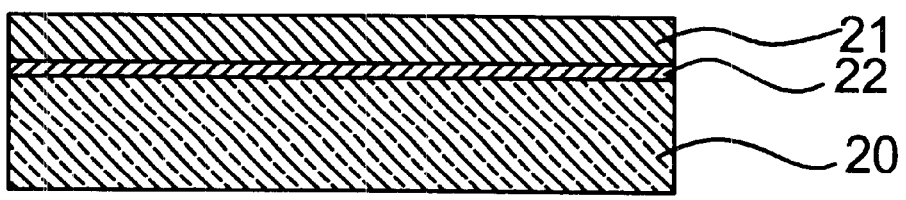

Referring to FIG. 2B, nitric oxide (hereinafter abbreviated NO) annealing is carried out on the exposed silicon oxide layer 21. As a result of NO annealing, a first oxynitride layer 22 is formed using nitrogen piled up at an interface between the silicon substrate 20 and the silicon oxide layer 21.

The first oxynitride layer 22, as well as, the silicon oxide layer 21 in part become a gate insulating layer for a MOS transistor. The first oxynitride layer 22 provides traps at the interface, thereby reducing transconductance of the gate insulating layer due to interaction among the traps. Hence, the embodiment of the present invention improves a characteristic of transconductance by removing the traps existing in the first oxynitride layer 22 by carrying out re-oxidation on the substrate including the first oxynitride layer at oxygen ambient.

Figure 2C:
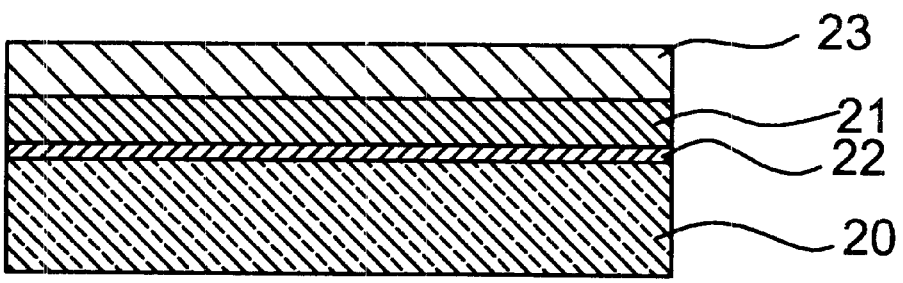
Figure 2D:
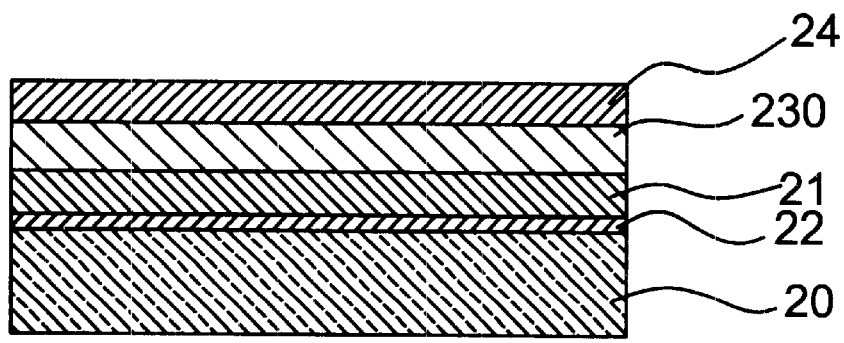

Referring to FIG. 2C, an undoped polysilicon layer 23 is formed on the exposed silicon oxide layer 21 by chemical vapor deposition to form a gate. The polysilicon layer 23 is preferably formed to about a 500–1000 Å thickness. In this case, the undoped polysilicon layer 23 is used, instead of a doped polysilicon layer, because nitrogen from a silicon nitride layer ($Si_3N_4$) 24 (see FIG. 2D) migrates into an interface between the polysilicon layer 23 and the silicon oxide layer 21 through the polysilicon layer 23 caused by energy from the following boron ion implantation. A silicon nitride layer 24 is formed on the undoped polysilicon layer 23 to provide nitrogen. The silicon nitride layer 24 is preferably deposited by CVD (see FIG. 2D).

Figure 2E:
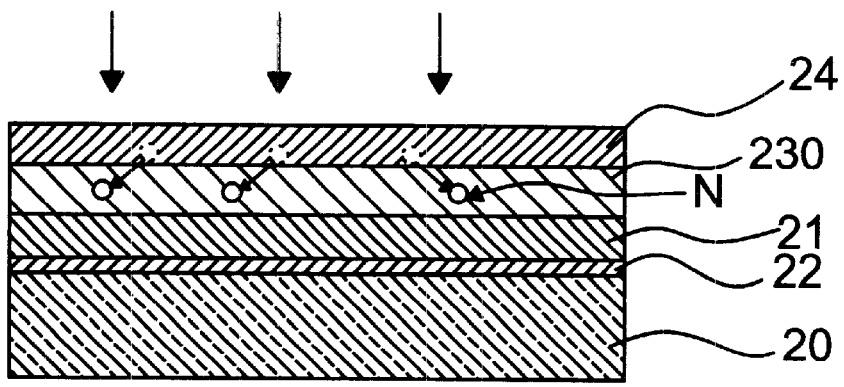

Referring to FIG. 2E, ion implantation is carried out over the substrate with boron ions, preferably B or $BF_2$, at a predetermined dose and energy to dope the undoped polysilicon 23. In this case, the dose of the ion implantation on which sheet resistance depends is preferably from about $1\times10^{14}$ to $9\times10^{15}$ ions/$cm^2$, and the energy, if B is ion implanted, ranges from about 5 to 10 KeV, while the energy if $BF_2$ is ion implanted ranges from about 20 to 30 KeV.

As a result of the boron ion implantation, the polysilicon layer 230 is doped with boron ions as soon as the nitrogen N in the silicon nitride layer 24 migrates into the polysilicon layer. This occurs because the implanted boron ions are projected into the silicon nitride layer 24. Hence, the polysilicon layer 230 for forming a gate electrode is doped with boron ions, preferably B or $BF_2$, as well as nitrogen N.

Figure 2F:

Referring to FIG. 2F, annealing is carried out on the substrate so as to pile up nitrogen at an interface between the silicon oxide layer 21 and the polysilicon layer 230, as well as, to activate the boron ions buried in the polysilicon layer 230 by ion implantation. As a result of the annealing, a second oxynitride layer 25 is formed at the interface between the silicon oxide layer 21 and the boron-doped polysilicon layer 230, thereby preventing boron-penetration into the silicon oxide layer 21.

Next, a gate electrode is formed by patterning the nitride layer 24, the doped polysilicon layer 230, the second oxynitride layer 25, the silicon oxide layer 21 and the first oxynitride layer 22 preferably by photolithography. The P type impurity diffusion regions doped with boron ions, preferably B, $BF_2$ or the like, are then formed in the substrate centering around the gate electrode used as an ion-implantation mask for ion implantation, thereby completing a PMOS transistor.

Figure 3:
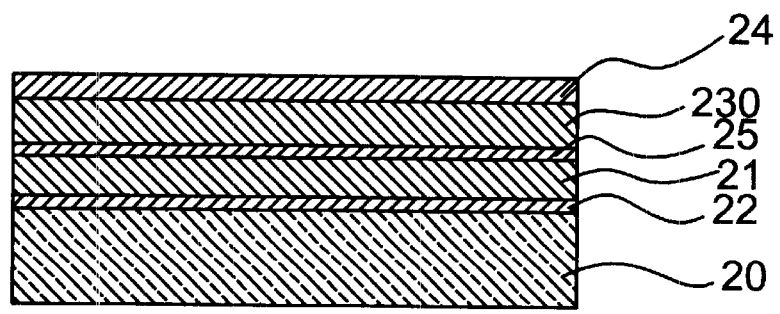
FIG. 3 illustrates a diagram of a cross-sectional view of a gate insulating layer according to the present invention.

FIG. 3 shows a cross-sectional view of a preferred embodiment of the present invention, particularly illustrating the patterned silicon oxide layer 21 which is the gate oxide layer 21, which in turn constitutes the gate insulating layer 21, where the top and bottom surfaces of the gate insulating layer 21 are in contact with the oxynitride layers 25, 22, respectively.

Referring to FIG. 3, a thin first oxynitride layer 22 lies on a silicon substrate 20 of an N type semiconductor substrate where a device isolating area and a device active region are defined by a device isolation layer (not shown in the drawing) such as a field oxide layer formed by LOCOS or STI. In this case, the area shown in FIG. 3 represents the device active area which may be referred to a silicon substrate doped with n type impurities or an n type well.

The first oxynitride layer 22 works as a barrier layer for preventing penetration by boron ions into the silicon substrate 20. A silicon oxide layer 21, constituting a gate insulating layer in part, lies on the first oxynitride layer 22. In this case, the silicon oxide layer 21 is formed over the first oxynitride layer 22 by thermal oxidation of an exposed surface of the silicon substrate 20 before the NO annealing for forming the first oxynitride layer 22.

A second oxynitride layer 25 lies on the silicon oxide layer 21 to provide a second barrier layer for preventing boron ion penetration. In this case, the second oxynitride layer 25 is formed by piling up nitrogen over the silicon oxide layer 21 by using the energy of the boron ion implantation. A doped polysilicon layer 230 doped with boron ions by implantation lies on the second oxynitride layer 25. Later, the polysilicon layer 230 will be patterned from a gate electrode. A silicon nitride layer 24 works as a donor of nitrogen used for forming the second oxynitride layer 25, and lies on the polysilicon layer 230.

Figure 4:
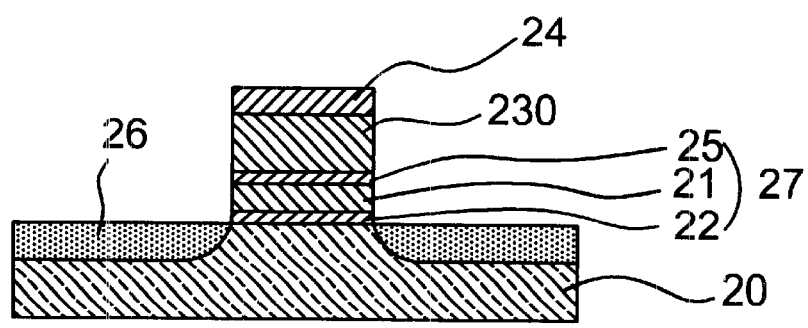
FIG. 4 illustrates a diagram of a cross-sectional view of a transistor in a semiconductor device according to the present invention.

FIG. 4 shows a cross-sectional view of a transistor in a semiconductor device according to a preferred embodiment of the present invention. A gate insulating layer 27 having a first oxynitride layer 22, a silicon oxide layer 21, and a second oxynitride layer 25 are formed successively on a substrate 20 in an active area of a semiconductor substrate. A gate electrode 230 is formed of a doped polysilicon layer on the second oxynitride layer 25 and a silicon nitride layer 24 is formed on the gate electrode 230. Impurity diffusion regions 26, centering around the gate electrode 230 are formed in the active area of the semiconductor substrate.

A PMOS device constructed with a gate insulating layer 27 with two oxynitride layers, a gate electrode 230, a silicon nitride layer 24, and impurity diffusion regions 26 is fabricated. In this case, the impurity diffusion regions 26 are doped with p type impurities. Therefore, a PMOS transistor with a gate insulating layer structure with two oxynitride layers is formed in accordance with a preferred embodiment of the present invention, which prevents gate dopants from diffusing into a channel region of the substrate, thereby improving the characteristic of the threshold voltage of the transistor.

Accordingly, the gate insulating layer structure according to the present invention with a first oxynitride layer/a silicon oxide layer/a second oxynitride layer structure increases the reliability of device characteristics by preventing boron ions from diffusing into a substrate and improves transconductance of the gate insulating layer by removing the traps in the first oxynitride layer.

It will be apparent to those skilled in the art that various modifications and variations can be made in semiconductor devices and fabricating methods thereof of the present invention without departing from the spirit or scope of the inventions. Thus, it is intended that the present invention cover the modifications and variations of this invention provided they come within the scope of the appended claims and equivalents.

What is claimed is:

1. A method of fabricating a gate insulating layer in a semiconductor device, comprising:
   forming an insulating layer on a semiconductor substrate;
   forming a first barrier layer at an interface between the semiconductor substrate and the insulating layer;
   forming a semiconductor layer on the insulating layer; and
   forming a second barrier layer at an interface between the semiconductor layer and the insulating layer, wherein the first and second barrier layers are formed of oxynitride layers.

2. The method of claim 1, wherein the first and second barrier layers are formed directly on the insulating layer.

3. The method of claim 2, wherein the first barrier layer undergoes re-oxidation in an oxygen ambient after the formation of the first barrier layer.

4. The method of claim 1, wherein the formation of the first barrier layer comprises:

forming an oxide layer on the semiconductor substrate; and forming an oxynitride layer as the first barrier layer by thermal treatment of the oxide layer in a nitrogen ambient.

5. The method of claim 4, wherein the nitrogen ambient is provided by a nitric oxide ambient.

6. The method of claim 1, wherein the semiconductor layer is formed of polysilicon.

7. The method of claim 1, wherein the formation of the second barrier layer comprises:

forming a nitrogen donating layer on the semiconductor layer;

doping the semiconductor layer with a dopant through the nitrogen donating layer; and forming an oxynitride layer as the second barrier layer at the interface between the insulating and semiconductor layers.

8. The method of claim 7, wherein the nitrogen donating layer is formed of a silicon nitride layer.

9. The method of claim 7, wherein the dopant comprises B or $BF_2$.

10. The method of claim 7, wherein the semiconductor layer is formed of a undoped polysilicon layer.

11. The method of claim 7, wherein the doping implants dopants into the semiconductor layer and causes nitrogen to pile up in the nitrogen donating layer and the semiconductor layer simultaneously.

12. The method of claim 11, wherein the dopants are diffused into the semiconductor layer and the oxynitride layer is formed at the interface between the semiconductor layer and the insulating layer.

13. The method of claim 7, wherein the oxynitride is formed by thermal treatment in a nitrogen ambient.

14. The method of claim 7, wherein the semiconductor layer and the nitrogen donating layer are formed by chemical vapor deposition.

15. A method of fabricating a semiconductor device, comprising:

forming an insulating layer on a semiconductor substrate;

forming a first barrier layer at an interface between the semiconductor substrate and the insulating layer;

forming a semiconductor layer on the insulating layer;

forming a second barrier layer at an interface between the semiconductor layer and the insulating layer, wherein the formation of the second barrier layer comprises:

forming a nitrogen donating layer on the semiconductor layer;

doping the semiconductor layer beneath the nitrogen donating layer with a dopant through the nitrogen donating layer, and forming an oxynitride layer as the second diffusion barrier layer at the interface between the insulating and semiconductor layers;

forming a gate electrode by patterning the semiconductor layer; and forming impurity regions around the gate electrode in the substrate.

16. The method of claim 15, wherein the first and second barrier layers are formed of oxynitride layers.

17. The method of claim 16, wherein the first barrier layer undergoes re-oxidation in an oxygen ambient after the formation of the first barrier layer.

18. The method of claim 15, wherein the formation of the first barrier layer comprises:

forming an oxide layer on the semiconductor substrate; and forming an oxynitride layer as the first barrier layer by thermal treatment of the oxide layer in a nitrogen ambient.

19. The method of claim 18, wherein the nitrogen ambient is provided by a nitric oxide ambient.

20. The method of claim 15, wherein the semiconductor layer is formed of undoped polysilicon.

forming impurity regions around the gate electrode in the substrate.

21. The method of claim 15, wherein the nitrogen donating layer is adjacent to the semiconductor layer.

22. The method of claim 21, wherein the nitrogen donating layer is formed of a silicon nitride layer.

23. A method of fabricating a gate insulating layer in a semiconductor device, comprising:

forming a silicon oxide insulating layer on a semiconductor substrate;

forming a first barrier layer at an interface between the semiconductor substrate and the silicon oxide insulating layer;

forming a semiconductor layer on the silicon oxide insulating layer;

forming a nitrogen donating layer on the semiconductor layer; and forming a second barrier layer at an interface between the semiconductor layer and the silicon oxide insulating layer.

24. The method of claim 23, wherein the nitrogen donating layer is formed directly on the semiconductor layer and the second barrier layer is formed in contact with the semiconductor layer and the silicon oxide insulating layer.

* * * * *